(12) United States Patent
Zheng et al.

(10) Patent No.: US 7,138,196 B2
(45) Date of Patent: Nov. 21, 2006

(54) LAYERED THIN-FILM MEDIA FOR PERPENDICULAR MAGNETIC RECORDING

(75) Inventors: Min Zheng, Milpitas, CA (US); Gunn Choe, San Jose, CA (US)

(73) Assignee: Maxtor Corporation, Longmont, CO (US)

( * ) Notice: Subject to any disclaimer, the term of this patent is extended or adjusted under 35 U.S.C. 154(b) by 458 days.

(21) Appl. No.: 10/207,698

(22) Filed: Jul. 29, 2002

(65) Prior Publication Data

US 2003/0091798 A1    May 15, 2003

Related U.S. Application Data

(60) Provisional application No. 60/345,404, filed on Nov. 9, 2001.

(51) Int. Cl.
  *G11B 5/66*    (2006.01)
  *G11B 5/70*    (2006.01)
(52) U.S. Cl. ...................................... 428/831
(58) Field of Classification Search .......... 428/694 TS, 428/336, 900, 694 TC, 694 T, 831, 831.2, 428/827
  See application file for complete search history.

(56) References Cited

U.S. PATENT DOCUMENTS

| 4,632,883 A | 12/1986 | Howard et al. ............. 428/611 |
| 4,743,491 A | 5/1988 | Asada et al. ................. 428/213 |
| 6,524,730 B1 * | 2/2003 | Chen ................... 428/694 TM |
| 6,607,842 B1 * | 8/2003 | Bian et al. .................. 428/611 |
| 6,641,935 B1 * | 11/2003 | Li et al. ................. 428/694 TS |
| 2003/0082407 A1 * | 5/2003 | Sakawaki et al. ..... 428/694 BA |

OTHER PUBLICATIONS

"RUxCr1-x/Ta underlayer for Co-Alloy Perpendicular Magnetic Recording" Weirman et al., presented at the 46th Magnetism and Magnetic Material's Conference, Seattle, WA, Nov. 12-16, 2001 (Abstract Mailed on Sep. 17, 2001).

* cited by examiner

*Primary Examiner*—Holly Rickman
(74) *Attorney, Agent, or Firm*—Marsh Fischmann & Breyfogle LLP

(57) ABSTRACT

A perpendicular magnetic recording medium having good perpendicular magnetic anisotropy. The magnetic recording medium includes a tantalum (Ta) seedlayer and a ruthenium (Ru) underlayer. The magnetic recording layer can be fabricated from cobalt (Co) alloys. With the Ta seedlayer, the perpendicular anisotropy and c-axis orientation of the magnetic recording layer are greatly enhanced. Unity squareness is achievable as is a negative nucleation field. The magnetic recording medium can be formed by sputtering the various layers onto a substrate. Thus, a perpendicular magnetic recording medium suitable for mass production is provided.

68 Claims, 5 Drawing Sheets

LAYERED THIN-FILM MEDIA FOR PERPENDICULAR MAGNETIC RECORDING

CROSS-REFERENCE TO RELATED APPLICATIONS

This application claims priority to U.S. Provisional Patent Application Ser. No. 60/345,404, filed on Nov. 9, 2001, the disclosure of which is incorporated herein by reference in its entirety.

BACKGROUND OF THE INVENTION

1. Field of the Invention

The present invention relates to improved perpendicular magnetic recording media. In particular, the present invention relates to perpendicular recording media having a magnetic recording layer with improved magnetic properties, including improved perpendicular coercivity, to enhance the areal density of the perpendicular recording media.

2. Description of Related Art

Thin film magnetic recording media are typically composed of multiple layers, including one or more magnetic recording layers, disposed on a rigid substrate. Traditionally, the magnetic layer includes magnetic grains that are oriented longitudinally (i.e., in plane) with respect to the magnetic layer. The areal density of longitudinal magnetic recording disks has been increasing at a compounded growth rate of about 60% per year and areal densities as high as 100 Gbit/in$^2$ have been demonstrated. However, with an increase in areal density, the volume of magnetic material within a single bit is reduced and the bit becomes highly susceptible to damage from thermal fluctuations, a phenomena referred to as a 'superparamagnetic' limit. This superparamagnetic limit places a constraint on increasing the areal density for longitudinal recording media beyond about 100 Gbit/in$^2$.

To go beyond areal densities of 100 Gbit/in$^2$, perpendicular magnetic recording media have been proposed. Perpendicular magnetic recording media include a magnetic recording layer having an easy magnetization axis that is perpendicular to the magnetic recording layer. Among the desirable properties for the magnetic recording layer used for perpendicular recording media are high perpendicular coercivity and anisotropy, a negative nucleation field and unity vertical squareness. Coercivity is a measure of the magnetization field that must be applied to reduce the remnant magnetization to zero, i.e., to reverse the direction of magnetization. A high perpendicular coercivity assures that the magnetic layer will have a high resistance to demagnetization by stray magnetic fields in the perpendicular direction. High perpendicular anisotropy means that the perpendicular coercivity is substantially higher than the horizontal coercivity. The nucleation field is the magnetic field that is necessary to begin to reduce the magnetization of the material to less than the saturation value. A material with a negative nucleation field has a highly stable remnant magnetization. Unity vertical squareness refers to a material property wherein the ratio of remnant to saturation magnetization ($M_r/M_s$) is one.

Cobalt-based alloys such as CoCr are typically utilized for the perpendicular magnetic layer. However, it is difficult to fabricate these and similar metal alloys such that all of the above magnetic properties are maintained in the magnetic layer.

It is known to use an underlayer disposed between the substrate and the magnetic layer in thin film recording media. For example, U.S. Pat. No. 4,632,883 by Howard et al. discloses the magnetic properties of a thin film alloy magnetic recording disk made with a CoCrX(X=Ta, Ti, Nb, Mo or W) magnetic layer and a β-Ta underlayer. The β-Ta underlayer has preferred [00.2] orientation and the vertical recording disk has an improved perpendicular coercivity ($H_{c\perp}$) of 1500 Oersted (Oe) and a horizontal coercivity ($H_{c\parallel}$) of 350 Oe.

U.S. Pat. No. 4,743,491 by Asada et al. discloses a perpendicular magnetic recording medium having an iron nitride ($Fe_xN$) magnetic layer, an intermediate layer and an underlayer made of at least one element selected from the group consisting V, Ru, Zn, Os, Rh, Ir, Mo, W, Re, Pt, Nb, Ta, Sn, Al, Au, Ag, Ti, or electrically conductive nitrides and oxides of these elements.

There is a need for perpendicular recording media having improved magnetic properties to enable increased areal density. It would be advantageous to provide a perpendicular magnetic recording medium wherein the magnetic recording layer has high perpendicular coercivity, high perpendicular anisotropy, a negative nucleation field and unity vertical squareness.

SUMMARY OF THE INVENTION

It is an objective of the present invention to provide a magnetic recording medium for perpendicular recording having improved magnetic properties to enable increased areal densities. The improved magnetic properties result from control over the crystal structure of the magnetic recording layer by the utilization of a seedlayer and an underlayer.

According to one aspect of the present invention, a magnetic recording medium for perpendicular recording is provided. The magnetic recording medium includes a substrate, a seedlayer including tantalum disposed over the substrate, an underlayer disposed on the seedlayer wherein the underlayer includes ruthenium and a magnetic recording layer disposed on the underlayer wherein the magnetic recording layer includes a metallic material having an easy magnetization axis (e.g., the c-axis) oriented perpendicular to the magnetic recording layer. The use of a seedlayer including tantalum and an underlayer including ruthenium advantageously influences the crystallographic structure of the magnetic recording layer, leading to improved magnetic properties and increased areal densities.

According to this aspect of the present invention, the metallic material can have a hexagonal close packed (hcp) crystallite structure with a c-axis oriented perpendicular to the magnetic recording layer. For example, the metallic material can be a cobalt-containing alloy, such as CoCr, CoCrPt or CoCrPtB. The seedlayer can include tantalum or a tantalum alloy, such as a tantalum alloy including at least about 80 at. % tantalum. According to one aspect of the present invention, the seedlayer consists essentially of tantalum. Preferably, the seedlayer is substantially amorphous and has a thickness of from about 1 nanometer to about 30 nanometers. The use of a seedlayer having an average thickness of not greater than about 30 nanometers results in a substantially amorphous seedlayer, as opposed to a crystalline seedlayer (e.g., one including β-Ta). The underlayer can be ruthenium or a ruthenium alloy, such as one having at least about 80 at. % ruthenium. In one preferred embodiment, the underlayer consists essentially of ruthenium. Preferably, the underlayer has an average thickness of from about 10 nanometers to about 20 nanometers.

The magnetic recording medium can also include other functional layers. For example, a soft magnetic layer can be disposed between the substrate and the seedlayer. Examples of soft magnetic layers include NiFe and CoZrNb. A soft magnetic layer can advantageously enhance the magnetic properties of the perpendicular magnetic recording layer. The substrate can be selected from a variety of materials and preferably is a substantially rigid material such as a glass or glass-containing material or a metal such as aluminum, optionally coated with a material such as nickel phosphorous (NiP).

The magnetic recording layer according to the present invention can have substantially improved magnetic properties. According to one aspect, the magnetic recording layer includes a cobalt-containing alloy and has a perpendicular coercivity of at least about 2500 Oe. The magnetic recording layer can advantageously have a negative nucleation field and a ratio of remnant magnetization to saturation magnetization of about 1. The horizontal coercivity of the magnetic recording layer can be very low, such as not greater than about 200 Oe, resulting in a material having high perpendicular anisotropy.

DESCRIPTION OF THE INVENTION

Figure 1:
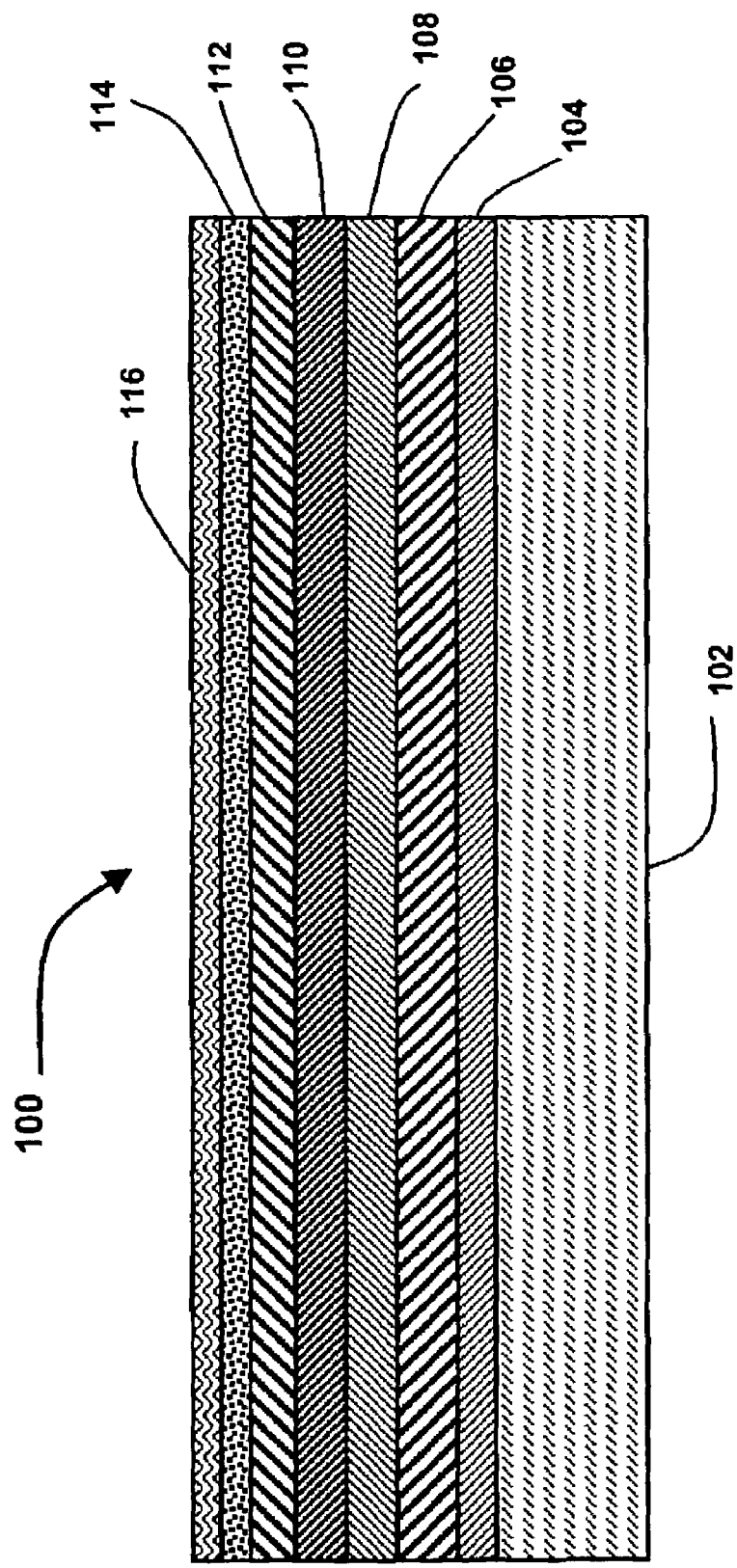
FIG. 1 illustrates a cross-sectional view of a layered perpendicular magnetic recording medium according to an embodiment of the present invention.

FIG. 1 illustrates a schematic view of a layered magnetic recording medium 100 according to an embodiment of the present invention. The magnetic recording medium 100 includes multiple layers that are deposited upon a rigid substrate 102. Among the layers formed on the rigid substrate 102 is a perpendicular magnetic recording layer 112. Disposed between the substrate 102 and the magnetic recording layer 112 is an underlayer 110 adapted to control the crystallographic properties of the magnetic recording layer 112 and a seedlayer 108 adapted to control the crystallographic properties of the underlayer 110. Through the use of this multi-layer structure, the perpendicular magnetic recording layer 112 can have significantly improved magnetic properties, enabling an increase in the areal density of the magnetic recording medium.

The rigid substrate 102 can be fabricated from a number of materials known to those skilled in the art to be useful for magnetic recording media, such as hard disks. A particularly preferred material for the rigid substrate 102 according to the present invention is aluminum (Al) coated with a layer of nickel phosphorous (NiP). However, it will be appreciated that the rigid substrate can also be fabricated from other materials, such as glass and glass-containing materials, including glass-ceramics. The rigid substrate 102 typically has an average thickness in the range of from about 10 mils to 75 mils (about 0.254 mm to 1.9 mm) and has a smooth surface upon which the remaining layers can be deposited.

A soft magnetic layer 106 can be disposed between the substrate 102 and the seedlayer 108. The soft magnetic layer 106 is adapted to provide a magnetic flux return and increase the perpendicular writing field in the magnetic recording layer 112. The soft magnetic layer 106 can be fabricated from a variety of soft magnetic materials, including iron-containing alloys such as a nickel iron alloy (NiFe) or other alloys such as a cobalt zirconium niobium alloy (CoZrNb). The soft magnetic layer typically has an average thickness of from about 50 nanometers to about 400 nanometers. An intermediate tantalum layer 104 can also be deposited between the soft magnetic layer 106 and the substrate 102 to improve adhesion of the soft magnetic layer 106 to the substrate 102.

According to the present invention, a seedlayer 108 is provided to control the grain structure and orientation of the underlayer 110. Thus, the seedlayer 108 is disposed directly beneath the underlayer 110. According to the present invention, the seedlayer preferably comprises tantalum (Ta). For example, the seedlayer can be formed from tantalum or a tantalum alloy. Preferably, the seedlayer includes at least about 80 at. % tantalum and more preferably at least about 90 at. % tantalum. In one preferred embodiment, the seedlayer consists essentially of tantalum.

The seedlayer preferably has an average thickness of at least about 1 nanometer. However, to maintain the desired amorphous structure, it is preferred that the average thickness of the seedlayer is not greater than about 30 nanometers and a preferred range is from about 1 nanometer to about 30 nanometers, and more preferably from about 2 nanometers to about 10 nanometers. It is also preferred that the seedlayer 108 have a substantially amorphous (non-crystalline) structure and preferably does not include the β-Ta crystalline phase. The presence of crystalline phases such as β-Ta can be determined by x-ray diffraction. One way to avoid the formation of a β-Ta crystalline phase is to control the thickness of the seedlayer, for example by maintaining the average thickness of the seedlayer at or below about 30 nanometers.

An underlayer 110 is disposed on the seedlayer 108. The underlayer is adapted to control the grain structure and orientation of the perpendicular magnetic layer 112. The underlayer 110 preferably is non-magnetic and comprises ruthenium (Ru) or a ruthenium alloy, such as a ruthenium alloy comprising at least about 80 at. % ruthenium and more preferably at least about 90 at. % ruthenium. In one preferred embodiment, the underlayer 110 consists essentially of ruthenium. The underlayer 110 preferably has an average thickness of at least about 1 nanometer, such as from about 10 nanometers to about 20 nanometers.

The perpendicular magnetic recording layer 112 is deposited over the underlayer 110. The magnetic recording layer 112 has an easy magnetization axis (e.g., the c-axis) that is oriented perpendicular to the surface of the magnetic recording layer 112. Useful materials for the magnetic recording layer 112 include cobalt-based alloys having a hexagonal close packed (hcp) structure. Cobalt can be alloyed with elements such as chromium (Cr), platinum (Pt), boron (B), niobium (Nb), tungsten (W) and tantalum (Ta). In one preferred embodiment, the magnetic recording layer 112 includes cobalt alloyed with chromium (CoCr). As used herein, the term CoCr alloys can include alloys having other components in addition to Co and Cr. For example, a CoCr alloy can also include platinum (CoCrPt) and the CoCrPt alloy can include other elements such as boron (CoCrPtB). According to one preferred embodiment of the present invention, the perpendicular magnetic layer includes a cobalt alloy comprising 10 at. % to 30 at. % Cr, 8 at. % to 60 at. % Pt and 0 at. % to 30 at. % B, the balance consisting essentially of Co. The magnetic recording medium preferably has an average thickness of at least about 1 nanometer, such as from about 15 nanometers to about 30 nanometers.

The perpendicular magnetic recording medium 100 can also include a protective layer 114 such as a protective carbon layer and a lubricant layer 116 disposed over the protective layer 114. These layers are adapted to reduce damage from the read/write head interactions with the recording medium during start/stop operations.

The foregoing layers can be deposited on the substrate using known deposition techniques. For example, deposition of the layers onto the substrate can be accomplished by physical vapor deposition, e.g., sputtering. Sputtering can be accomplished using gases such as Ar, Kr or Xe. For the underlayer and the magnetic recording layer, it is preferred to sputter at a pressure of from about 2 mTorr to about 60 mTorr. The substrate can be heated prior to sputtering and can be annealed after one or more of the layers has been deposited to relieve residual stresses.

The use of a tantalum-containing seedlayer and a ruthenium-containing underlayer for the perpendicular recording media according to the present invention advantageously results in a substantially improved Co (0002) preferred orientation in the cobalt-containing magnetic recording layer and the magnetic recording layer has significantly improved perpendicular anisotropy. According to one preferred embodiment, the magnetic recording layer comprises a cobalt-containing alloy, such as CoCrPtB, and has a perpendicular coercivity of at least about 2500 Oe and more preferably at least about 3300 Oe. Conversely, the horizontal (i.e., longitudinal) coercivity of the alloy is preferably not greater than about 200 Oe. The magnetic recording layer preferably has a ratio of remnant to saturation magnetization ($M_r/M_s$) that is near unity, i.e., is equal to about one. In addition, the magnetic recording layer preferably has a negative nucleation field (less than zero) and more preferably has a nucleation field that is less (i.e., more negative) than about −500 Oe. It will be appreciated that the magnetic recording layer according to the present invention can have any one of the aforementioned magnetic properties, or any combination of two or more of the desired magnetic properties.

EXAMPLES

Perpendicular magnetic recording media according to the present invention were fabricated by sputtering the various layers onto a glass substrate. The seedlayer was composed of Ta and had an average thickness of about 5 nanometers. The underlayer was composed of Ru and had an average thickness of about 15 nanometers. The magnetic layer was composed of a CoCrPtB alloy ($CoCr_{18}Pt_{16}B_4$) having an average thickness of about 25 nanometers. All layers were sputtered onto the substrate with argon (Ar) at a pressure of 4 mTorr. For comparison, samples were also prepared that did not include a Ta seedlayer.

Figure 2:
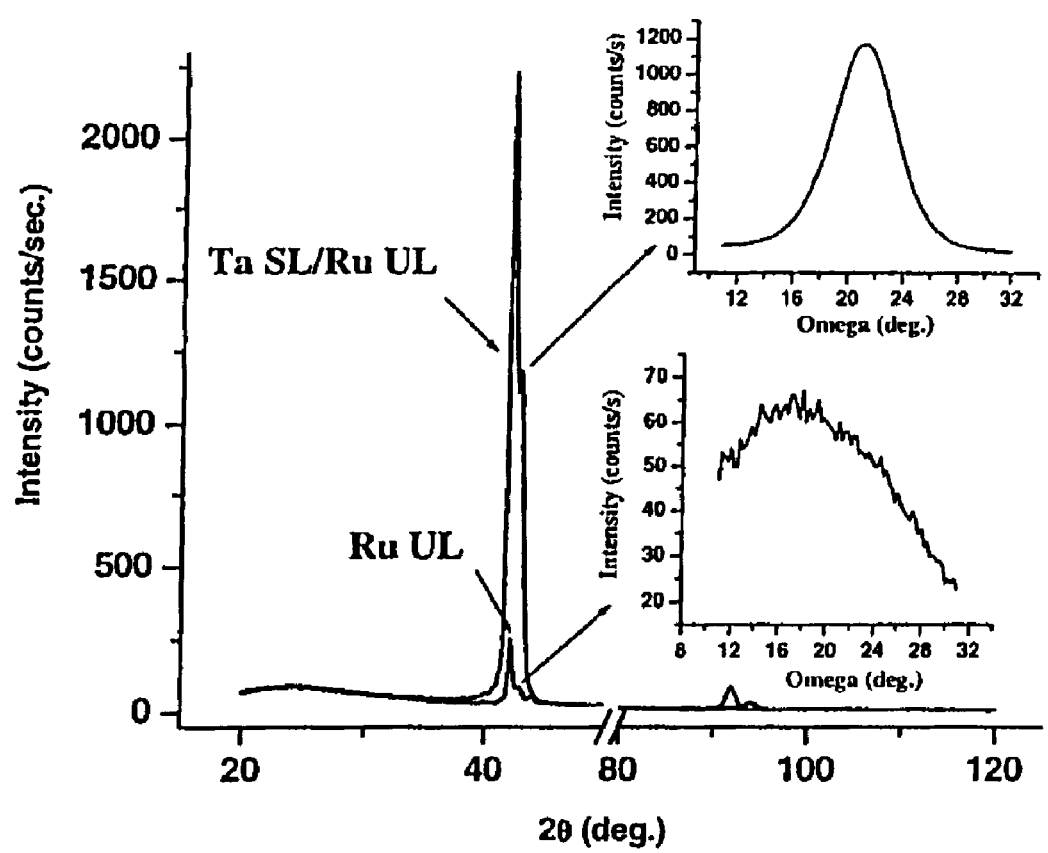
FIG. 2 illustrates x-ray diffraction patterns of a magnetic recording layer fabricated with and without a tantalum seedlayer.

FIG. 2 illustrates the x-ray diffraction pattern of a magnetic recording layer according to the present invention compared to a magnetic recording layer that did not include a seedlayer. With Ta as seedlayer, the intensity of the Co (0002) diffraction peak is greatly enhanced compared to the magnetic recording medium without a Ta seedlayer. This indicates that the Ta seedlayer enhanced the c-axis orientation of the Co hexagonal close packed structure, as is desirable for perpendicular magnetic recording.

The insets of FIG. 2 illustrate the rocking curves for the two magnetic recording layers. A rocking curve is obtained by rotating the magnetic recording layer through a known angle (omega) and measuring the resulting intensity. The width of the rocking curve is a direct measure of the range of crystal orientation present in the sample, as each sub grain of the layer will come into orientation as the layer is rotated. A broad rocking curve indicates a wide range of crystal orientations, which is undesirable for perpendicular magnetic recording. As is illustrated in FIG. 2, a much narrower rocking curve is observed for the magnetic recording layer having a Ta seedlayer. The rocking curve width is about 6° for the magnetic recording layer having a Ta seedlayer compared with a width of about 16° for the magnetic layer without a Ta seedlayer, indicating a narrower dispersion of Co (0002) grains in the sample with a Ta seedlayer.

Figure 3:
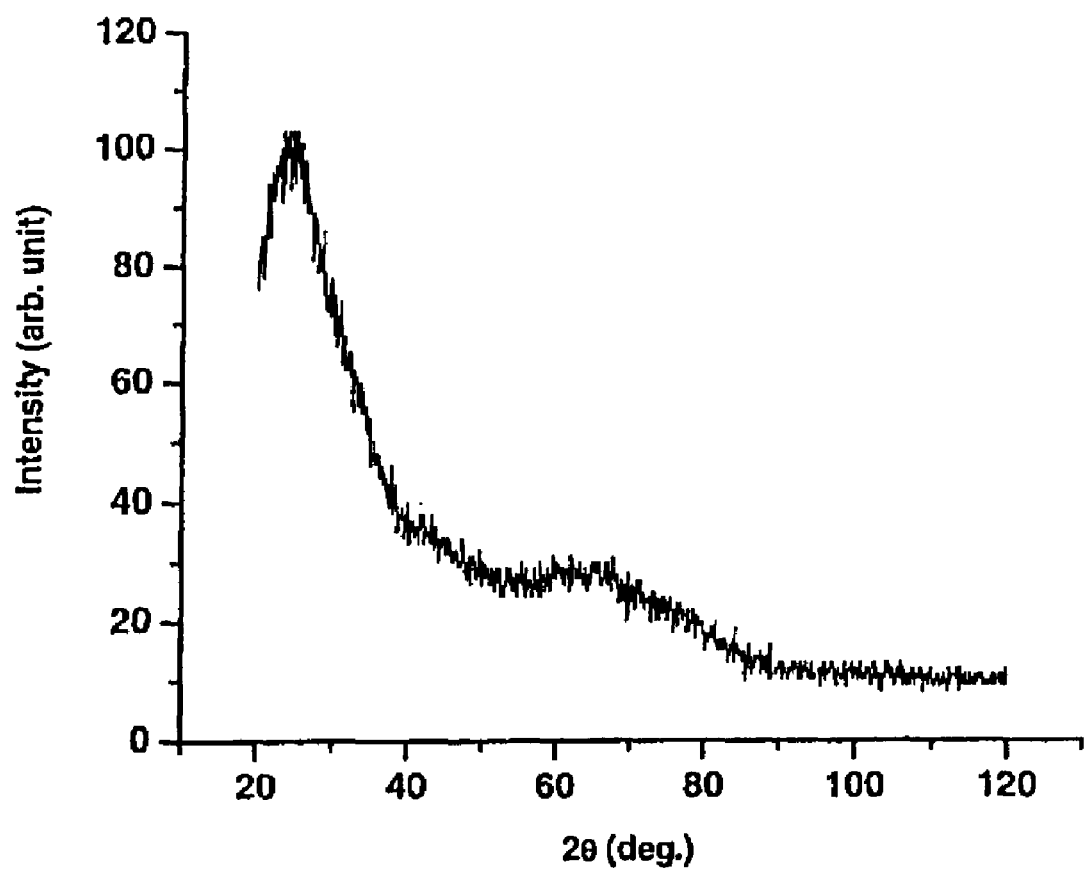
FIG. 3 illustrates an x-ray diffraction pattern for an amorphous tantalum seedlayer according to an embodiment of the present invention.

FIG. 3 illustrates an x-ray diffraction pattern for a Ta seedlayer according to the present invention. The x-ray diffraction pattern has no well-defined peaks, indicating that the tantalum is in an amorphous or nanocrystalline form, and is not in the crystalline β-Ta form.

Figure 4:
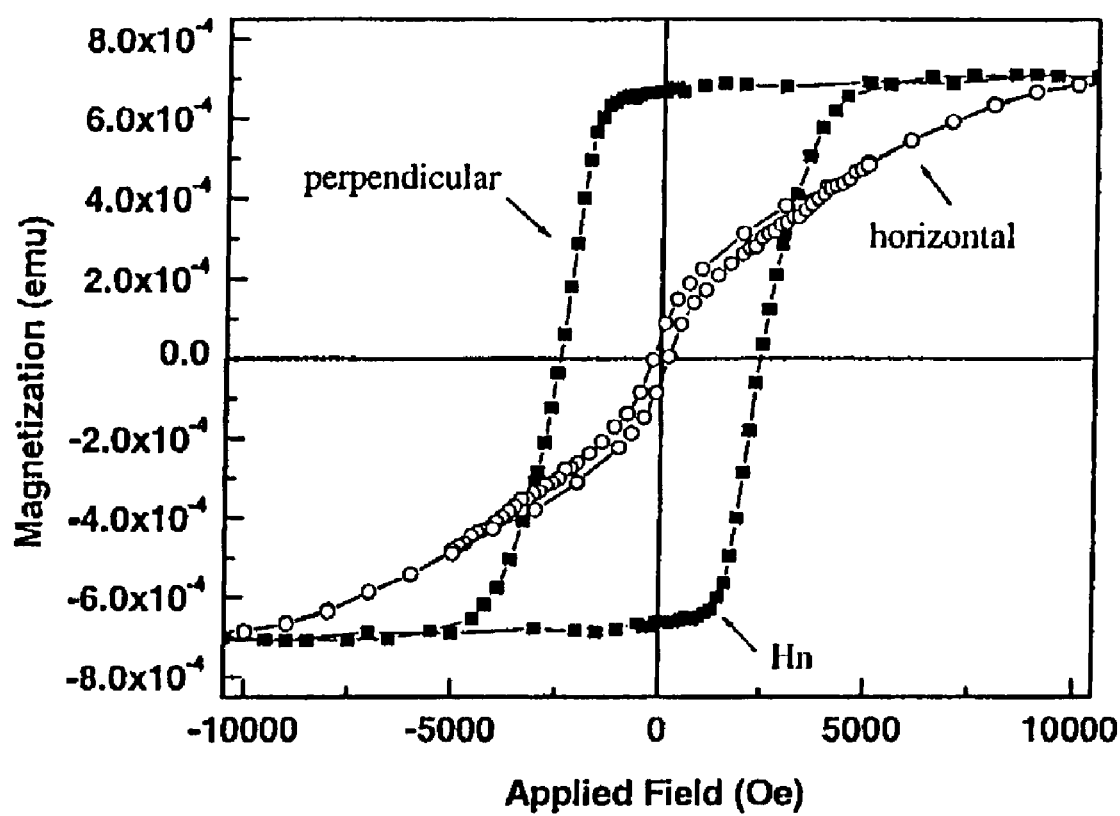
FIG. 4 illustrates a plot of the perpendicular and horizontal hysteresis loops for a magnetic recording layer disposed over a tantalum seedlayer according to an embodiment of the present invention.
Figure 5:
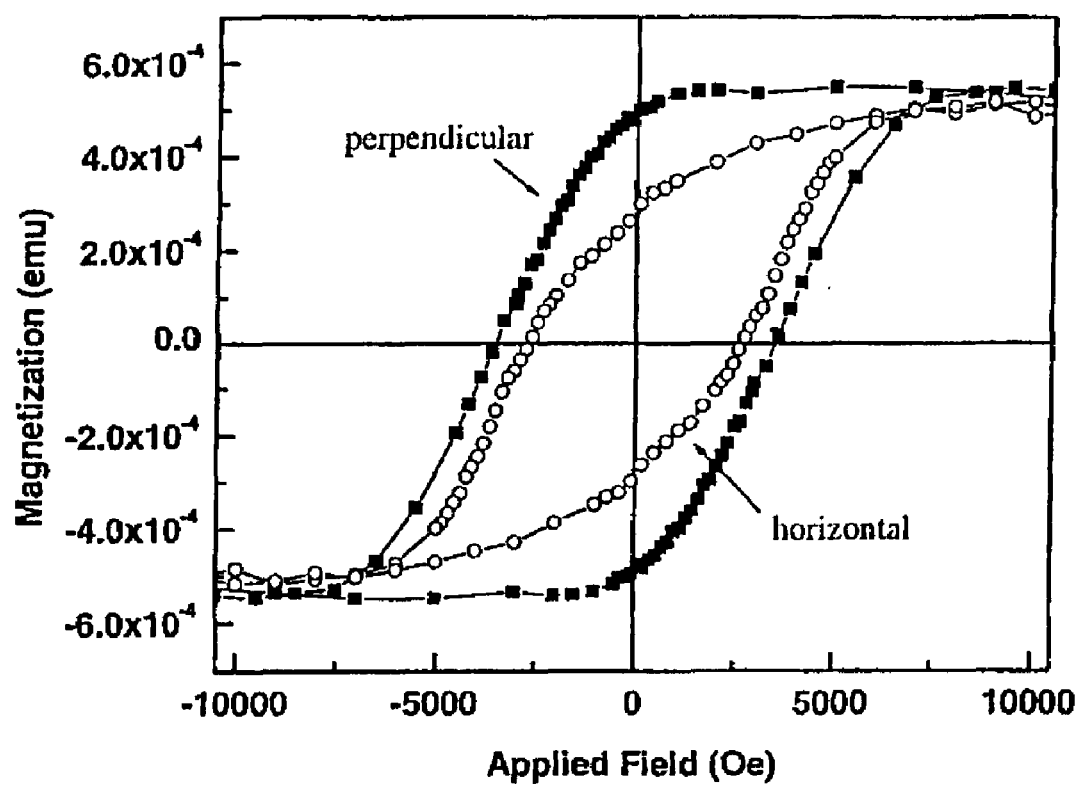
FIG. 5 illustrates a plot of the perpendicular and horizontal hysteresis loops for a magnetic recording layer that is not disposed over a tantalum seedlayer.

Perpendicular magnetic hysteresis loops for the magnetic recording layer with and without tantalum as a seedlayer were also measured and are illustrated in FIG. 4 and FIG. 5. FIG. 4 illustrates perpendicular and horizontal hysteresis loops for the magnetic recording layer with tantalum as a seedlayer. The perpendicular coercivity ($H_{c\perp}$) is about 2500 Oe. The magnetic material also has unity squareness ($M_r/M_s=1$) and a negative nucleation field ($H_n$) of about −800 Oe. Further, the magnetic recording layer has a lesser slope and a weaker horizontal hysteresis loop. The horizontal coercivity ($H_{c\|}$) was about 186 Oe.

By comparison, FIG. 5 illustrates that without a Ta seedlayer, the magnetic layer had a perpendicular squareness ($M_r/M_s$) of about 0.83 and a positive nucleation field ($H_n$). Further, the horizontal hysteresis loop was much stronger than was obtained when a Ta seedlayer was used (FIG. 4).

Other examples of a magnetic recording medium according to the present invention were fabricated. Processing variables included varying the sputtering pressure in the sputtering chamber. When sputtering the Ta seedlayer at a high pressure (e.g., 12 mTorr), a perpendicular coercivity of 3400 Oe was achieved in the magnetic layer, along with unity squareness and a negative nucleation filed of −600 Oe.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A magnetic recording medium for perpendicular recording, comprising:
    (a) a substrate;
    (b) a seedlayer comprising at least about 80 at. % tantalum disposed over said substrate;
    (c) an underlayer disposed directly on said seedlayer, wherein said underlayer comprises at least about 80 at. % ruthenium; and
    (d) a magnetic recording layer disposed on said underlayer wherein said magnetic recording layer comprises a magnetic material having an easy magnetization axis oriented perpendicular to said magnetic recording layer, and wherein said underlayer is adapted to control the grain structure and orientation of said magnetic recording layer.

2. A magnetic recording medium as recited in claim 1, wherein said magnetic material comprises a hcp crystallite structure having a c-axis oriented perpendicular to said magnetic recording layer.

3. A magnetic recording medium as recited in claim 1, wherein said magnetic material is a cobalt-containing alloy.

4. A magnetic recording medium as recited in claim 1, wherein said magnetic material is a CoCr alloy.

5. A magnetic recording medium as recited in claim 1, wherein said magnetic material is a CoCrPt alloy.

6. A magnetic recording medium as recited in claim 1, wherein said magnetic material is a CoCrPtB alloy.

7. A magnetic recording medium as recited in claim 1, wherein said magnetic material is a cobalt-containing alloy comprising 10 at. % to 30 at. % Cr and 8 at. % to 60 at. % Pt.

8. A magnetic recording medium as recited in claim 1, wherein said magnetic material is a cobalt-containing alloy comprising 10 at. % to 30 at. % Cr, 8 at. % to 60 at. % Pt and up to 30 at. % B.

9. A magnetic recording medium as recited in claim 1, wherein said magnetic recording layer has an average thickness of from about 15 nanometers to about 30 nanometers.

10. A magnetic recording medium as recited in claim 1, wherein said seedlayer consists essentially of tantalum.

11. A magnetic recording medium as recited in claim 1, wherein said seedlayer is substantially amorphous.

12. A magnetic recording medium as recited in claim 1, wherein said seedlayer has an average thickness of from about 1 nanometer to about 30 nanometers.

13. A magnetic recording medium as recited in claim 1, wherein said underlayer consists essentially of ruthenium.

14. A magnetic recording medium as recited in claim 1, wherein said underlayer has an average thickness of at least about 1 nanometer.

15. A magnetic recording medium as recited in claim 1, wherein said underlayer has an average thickness of from about 10 nanometers to about 20 nanometers.

16. A magnetic recording medium as recited in claim 1, wherein said magnetic recording medium further comprises a soft magnetic layer disposed between said substrate and said seedlayer.

17. A magnetic recording medium as recited in claim 16, wherein said soft magnetic layer comprises NiFe.

18. A magnetic recording medium as recited in claim 16, wherein said soft magnetic layer comprises a CoZrNb alloy.

19. A magnetic recording medium as recited in claim 16, further comprising an adhesive layer disposed between said substrate and said soft magnetic layer.

20. A magnetic recording medium as recited in claim 16, further comprising an adhesive layer disposed between said substrate and said soft magnetic layer, wherein said adhesive layer comprises tantalum.

21. A magnetic recording medium as recited in claim 1, further comprising a carbon protective layer disposed over said magnetic recording layer.

22. A magnetic recording medium as recited in claim 21, further comprising a lubricant layer disposed over said carbon protective layer.

23. A magnetic recording medium as recited in claim 1, wherein said substrate comprises a glass-containing material.

24. A magnetic recording medium as recited in claim 1, wherein said substrate comprises aluminum coated with NiP.

25. A magnetic recording medium as recited in claim 1, wherein said magnetic recording layer comprises a cobalt-containing alloy and has a perpendicular coercivity ($H_c\perp$) of at least about 2500 Oe.

26. A magnetic recording medium as recited in claim 25, wherein said magnetic recording layer has a negative nucleation field.

27. A magnetic recording medium as recited in claim 25, wherein said magnetic recording layer has a ratio of remnant magnetization to saturation magnetization ($M_r/M_s$) of about 1.

28. A magnetic recording medium for perpendicular recording, comprising:
   (a) a substrate;
   (b) a seedlayer comprising tantalum disposed over said substrate;
   (c) a soft magnetic layer disposed between said substrate and said seedlayer;
   (d) an underlayer disposed on said seedlayer; and
   (e) a magnetic recording layer disposed on said underlayer, wherein said magnetic recording layer comprises a cobalt-containing alloy having an easy magnetization axis oriented perpendicular to said magnetic recording layer and having a perpendicular coercivity of at least about 2500 Oe and a horizontal coercivity of not greater than about 200 Oe.

29. A magnetic recording medium as recited in claim 28, wherein said magnetic recording layer has a negative nucleation field.

30. A magnetic recording medium as recited in claim 28, wherein said magnetic recording layer has a ratio of remnant magnetization to saturation magnetization ($M_r/M_s$) of about 1.

31. A magnetic recording medium as recited in claim 28, wherein said underlayer comprises at least about 80 at. % ruthenium.

32. A magnetic recording medium as recited in claim 28, wherein said underlayer consists essentially of ruthenium.

33. A magnetic recording medium as recited in claim 28, wherein said seedlayer comprises at least about 80 at. % tantalum.

34. A magnetic recording medium as recited in claim 33, wherein said seedlayer is substantially amorphous.

35. A magnetic recording medium as recited in claim 33, wherein said seedlayer has an average thickness of not greater than about 30 nanometers.

36. A magnetic recording medium as recited in claim 28, wherein said seedlayer consists essentially of tantalum.

37. A magnetic recording medium as recited in claim 28, wherein said cobalt-containing alloy has a hexagonal crystallite structure having a c-axis oriented perpendicular to said magnetic recording layer.

38. A magnetic recording medium as recited in claim 37, wherein said cobalt-containing alloy is a CoCr alloy.

39. A magnetic recording medium as recited in claim 37, wherein said cobalt-containing alloy is a CoCrPt alloy.

40. A magnetic recording medium as recited in claim 37, wherein said cobalt-containing alloy is a CoCrPtB alloy.

41. A magnetic recording medium as recited in claim 37, wherein said cobalt-containing alloy comprises 10 at. % to 30 at. % Cr and 8 at. % to 60 at. % Pt, the balance consisting essentially of Co.

42. A magnetic recording medium as recited in claim 37, wherein said cobalt-containing alloy comprises 10 at. % to 30 at. % Cr, 8 at. % to 60 at. % Pt, up to 30 at. % B, the balance consisting essentially of Co.

43. A magnetic recording medium for perpendicular recording, comprising:
(a) a substrate;
(b) a seedlayer disposed over said substrate and comprising at least about 90 at. % tantalum;
(c) an underlayer disposed on said seedlayer, wherein said underlayer comprises at least about 90 at. % ruthenium; and
(d) a magnetic recording layer disposed on said underlayer, wherein said magnetic recording layer comprises a CoCr alloy having a hcp crystallite structure and having a c-axis oriented perpendicular to said magnetic recording layer and having a perpendicular coercivity of at least about 2500 Oe.

44. A magnetic recording medium as recited in claim 43, wherein said CoCr alloy is a CoCrPt alloy.

45. A magnetic recording medium as recited in claim 43, wherein said CoCr alloy is a CoCrPtB alloy.

46. A magnetic recording medium as recited in claim 43, wherein said underlayer consists essentially of ruthenium.

47. A magnetic recording medium as recited in claim 43, wherein said seedlayer consists essentially of tantalum.

48. A magnetic recording medium as recited in claim 43, wherein said seedlayer is substantially amorphous.

49. A magnetic recording medium as recited in claim 43, wherein said seedlayer has an average thickness of not greater than about 30 nanometers.

50. A magnetic recording medium for perpendicular recording, comprising:
(a) a substrate;
(b) a seedlayer disposed over said substrate, said seedlayer comprising tantalum and having an average thickness of not greater than about 30 nanometers;
(c) an underlayer comprising ruthenium disposed on said seedlayer; and
(d) a magnetic recording layer disposed on said underlayer, wherein said magnetic recording layer comprises a cobalt-containing alloy having an easy magnetization axis oriented perpendicular to said magnetic recording layer and having a perpendicular coercivity of at least about 2500 Oe.

51. A magnetic recording medium as recited in claim 50, wherein said magnetic recording layer has a negative nucleation field.

52. A magnetic recording medium as recited in claim 50, wherein said magnetic recording layer has a ratio of remnant magnetization to saturation magnetization ($M_r/M_s$) of about 1.

53. A magnetic recording medium as recited in claim 50, wherein said magnetic recording layer has a horizontal coercivity of not greater than about 200 Oe.

54. A magnetic recording medium as recited in claim 50, wherein said underlayer comprises at least about 80 at. % ruthenium.

55. A magnetic recording medium as recited in claim 50, wherein said underlayer consists essentially of ruthenium.

56. A magnetic recording medium as recited in claim 50, wherein said seedlayer comprises at least about 80 at. % tantalum.

57. A magnetic recording medium as recited in claim 50, wherein said seedlayer is substantially amorphous.

58. A magnetic recording medium as recited in claim 50, wherein said seedlayer consists essentially of tantalum.

59. A magnetic recording medium as recited in claim 50, wherein said cobalt-containing alloy has a hexagonal crystallite structure having a c-axis oriented perpendicular to said magnetic recording layer.

60. A magnetic recording medium as recited in claim 59, wherein said cobalt-containing alloy is a CoCr alloy.

61. A magnetic recording medium as recited in claim 59, wherein said cobalt-containing alloy is a CoCrPt alloy.

62. A magnetic recording medium as recited in claim 59, wherein said cobalt-containing alloy is a CoCrPtB alloy.

63. A magnetic recording medium as recited in claim 59, wherein said cobalt-containing alloy comprises 10 at. % to 30 at. % Cr and 8 at. % to 60 at. % Pt, the balance consisting essentially of Co.

64. A magnetic recording medium as recited in claim 59, wherein said cobalt-containing alloy comprises 10 at. % to 30 at. % Cr, 8 at. % to 60 at. % Pt, up to 30 at. % B, the balance consisting essentially of Co.

65. A magnetic recording medium for perpendicular recording, comprising:
(a) a substrate;
(b) a seedlayer disposed over said substrate;
(c) an underlayer comprising at least about 80 at. % ruthenium disposed on said seedlayer; and
(d) a magnetic recording layer disposed directly on said underlayer, wherein said magnetic recording layer comprises a cobalt-containing alloy having an easy magnetization axis oriented perpendicular to said magnetic recording layer and having a perpendicular coercivity of at least about 2500 Qe and a horizontal coercivity of not greater than about 200 Oe.

66. A magnetic recording medium as recited in claim 65, further comprising a soft magnetic layer disposed between said substrate and said seedlayer.

67. A magnetic recording medium as recited in claim 65, wherein said seedlayer comprises tantalum.

68. A magnetic recording medium as recited in claim 65, wherein said seedlayer comprises at least about 80 at. % tantalum.

* * * * *

UNITED STATES PATENT AND TRADEMARK OFFICE
CERTIFICATE OF CORRECTION

| | | |
|---|---|---|
| PATENT NO. | : 7,138,196 B2 | Page 1 of 1 |
| APPLICATION NO. | : 10/207698 | |
| DATED | : November 21, 2006 | |
| INVENTOR(S) | : Zheng et al. | |

It is certified that error appears in the above-identified patent and that said Letters Patent is hereby corrected as shown below:

Column 10
Line 42, claim 65 delete "Qe" and insert therefor --Oe--.

Signed and Sealed this

Twentieth Day of March, 2007

JON W. DUDAS
*Director of the United States Patent and Trademark Office*